(12) United States Patent
Yoshida

(10) Patent No.: US 6,724,022 B1
(45) Date of Patent: Apr. 20, 2004

(54) SOLID-STATE IMAGING DEVICE

(75) Inventor: Hiroyuki Yoshida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/583,277

(22) Filed: May 31, 2000

(30) Foreign Application Priority Data

May 31, 1999 (JP) ............................................. P11-152102

(51) Int. Cl.[7] ..................... H01L 27/148; H01L 29/768
(52) U.S. Cl. ...................... 257/233; 257/232; 257/240
(58) Field of Search ................................. 257/240, 232, 257/233

(56) References Cited

U.S. PATENT DOCUMENTS 5,589,698 A * 12/1996 Nakashiba .................. 257/231
5,742,081 A * 4/1998 Furumiya .................... 257/231

* cited by examiner

Primary Examiner—Amir Zarabian
Assistant Examiner—Keisha Rose
(74) Attorney, Agent, or Firm—Sonnenschein, Nath & Rosenthal LLP

(57) ABSTRACT

Disclosed herein is a solid-state imaging device having an effective pixel portion, an optical black portion, and a charge transfer register portion commonly provided in the effective pixel portion and the optical black portion, wherein the register width of a portion of the charge transfer register portion in the optical black portion is set larger than the register width of a portion of the charge transfer register portion in the effective pixel portion. With this configuration, the general dynamic range in the solid-state imaging device can be improved.

18 Claims, 15 Drawing Sheets

000
SOLID-STATE IMAGING DEVICE

RELATED APPLICATION DATA

The present application claims priority to Japanese Application No. P11-52102 filed May 31, 1999, which application is incorporated herein by reference to the extent permitted by law.

BACKGROUND OF THE INVENTION

The present invention relates to a solid-state imaging device, and more particularly to a solid-state imaging device having an effective pixel portion and an optical black (OPB) portion arranged in the same column.

Referring to FIG. 13, reference numeral 1 generally denotes an interline transfer CCD solid-state imaging device having a vertical optical black portion in the vertical direction of an effective pixel region known as a solid-state imaging device.

The CCD solid-state imaging device 1 has an imaging region 6 composed of an effective pixel region 4 and an optical black pixel portion (which will be hereinafter referred to as OPB portion) 5 for detecting a black level. The effective pixel region 4 has a plurality of photosensor portions 2 arranged in the form of matrix. Each photosensor portion 2 is formed by a photodiode for performing optoelectric conversion of incident light. The effective pixel region 4 further has a plurality of vertical transfer register portions 3 each having a CCD structure, respectively corresponding to the columns of the photosensors 2 in such a manner that each vertical transfer register portion 3 extends along one side of the corresponding column of the photosensor portions 2. The OPB portion 5 is formed around the effective pixel region 4 as shown by the hatching in FIG. 13 so as to be optically shielded. The solid-state imaging device 1 further has a horizontal transfer register portion 7 having a CCD structure and a charge detecting portion 8. Reference numeral 9 denotes a unit effective pixel in the effective pixel region 4.

The OPB portion 5 has a vertical OPB portion 5V formed in a vertically extended region of the effective pixel region 4. The vertical OPB portion 5V has a portion 10 corresponding to the photosensor portion 2. This portion 10 and a transfer portion corresponding to one bit of the vertical transfer register portion 3 constitute a unit optical black pixel 11. The effective pixel 9 and the optical black pixel 11 of the same column commonly have the same vertical transfer register portion 3.

In the CCD solid-state imaging device 1, signal charge obtained by opto-electric conversion at the photosensor portion 2 in the effective pixel region 4 and charge at the vertical OPB portion 5V are read to the vertical transfer register portion 3 at given periods, and then transferred toward the horizontal transfer register portion 7 by four-phase vertical driving clock pulses $\phi V_1$, $\phi V_2$, $\phi V_3$, and $\phi V_4$ (see FIG. 21), for example. In the horizontal transfer register portion 7, the charge at the vertical OPB portion 5V and the signal charge at the photosensor portion 2 both transferred from the vertical transfer register portion 3 are sequentially fed to the charge detecting portion 8 bit by bit by two-phase horizontal driving clock pulses $\phi H_1$ and $\phi H_2$. In the charge detecting portion 8, the input charge is converted into voltage, which is then output as a voltage signal.

Referring to FIG. 21, $T_1$ denotes a reading time, and each of $\phi V_1$ and $\phi V_3$ is a ternary pulse having a reading pulse $P_1$. $\phi$s denotes an electronic shuttering pulse, and $T_2$ denotes an exposure time by electronic shuttering.

FIG. 14 is an enlarged plan view of the unit pixel 9 in the effective pixel region 4 shown in FIG. 13, and FIG. 15 is a cross section taken along the line C–C' in FIG. 14. FIG. 16 is an enlarged plan view of the unit optical black pixel 11 in the vertical OPB portion 5V shown in FIG. 13, and FIG. 17 is a cross section taken along the line E–E' in FIG. 16.

This CCD solid-state imaging device 1 is so configured as to have a vertical overflow drain structure.

As shown in FIGS. 14 and 15, the effective pixel region 4 has the following structure. A silicon substrate 12 of first conduction type, e.g., n-type, is provided, and a first semiconductor well region 13 of second conduction type, i.e., p-type, is formed on the silicon substrate 12. An n-type semiconductor region 14 is formed on the upper surface of the first p-type semiconductor well region 13, and a $p^{++}$ positive charge storage region 15 is formed on the upper surface of the n-type semiconductor region 14, so as to form the photosensor portion 2. Further, a second p-type semiconductor well region 16 and an n-type transfer channel region 17 are formed in the first p-type semiconductor well region 13 at a position separate from the photosensor portion 2. A p-type channel stop region 18 is also formed in the first p-type semiconductor well region 13.

The photosensor portion 2 as a so-called HAD (Hole Accumulation Diode) sensor is formed by the first p-type semiconductor well region 13, the n-type semiconductor region 14, and the $p^{++}$ positive charge storage region 15.

The first p-type semiconductor well region 13 functions as a so-called overflow barrier region. A reading gate portion 19 is formed between the photosensor portion 2 and the vertical transfer register portion 3 to be hereinafter described. A p-type semiconductor region 20 is formed in the surface of the substrate at a position corresponding to the reading gate portion 19.

A transfer electrode 22 of polysilicon, for example, is formed through a gate insulating film 21 on the transfer channel region 17, the channel stop region 18, and the p-type semiconductor region 20 of the reading gate portion 19. The vertical transfer register portion 3 having a CCD structure is formed by the transfer channel region 17, the gate insulating film 21, and the transfer electrode 22.

Further, an interlayer dielectric 23 is formed so as to cover the transfer electrode 22, and a light shielding film 25 such as an Al film is formed on the entire surface except an opening 24 of the photosensor portion 2.

As shown in FIGS. 16 and 17, the vertical OPB portion 5V has the following structure. The n-type semiconductor region 14 mentioned above is not formed at the portion 10 corresponding to the photosensor portion 2, but only the $p^{++}$ positive charge storage region 15 is formed on the upper surface of the first p-type semiconductor well region 13. Thus, no photodiode is formed at the portion 10. Further, the light shielding film 25 is formed on the entire surface including the portion 10. The other configuration is similar to that of the effective pixel region 4, so the corresponding parts are denoted by the same reference numerals and the description thereof will be omitted herein to avoid repetition.

The register width ($=W_0$) of the vertical transfer register portion 3 in the effective pixel region 4 is set equal to the register width ($=W_0$) of the vertical transfer register portion 3 in the vertical OPB portion 5V. The gate length ($=d_0$) of the reading gate portion 19 in the effective pixel region 4 is set equal to the gate length ($=d_0$) of the reading gate portion 19 in the vertical OPB portion 5V. Further, the area (=$a_0 \times b_0$) of the photosensor portion 2 in the effective pixel region 4 is set equal to the area (=$a_0 \times b_0$) of the portion 10 in the vertical OPB portion 5V.

In the CCD solid-state imaging device 1 mentioned above, the area of the photosensor portion 2 tends to be increased to improve the sensitivity with a reduction in size and an increase in number of pixels. As a result, the area of the vertical transfer register portion 3 is necessarily reduced, and the general dynamic range (corresponding to a so-called maximum handling charge amount) in the CCD solid-state imaging device 1 is determined by the dynamic range in the vertical transfer register portion 3.

As mentioned above, the portion 10 in the vertical OPB portion 5V corresponding to the photosensor portion 2 in the effective pixel region 4 has such a structure that the n-type semiconductor region 14 for forming a photodiode is not formed so as to prevent opto-electric conversion of transmitted light through the light shielding film 25, and that only the $p^{++}$ positive charge storage region 15 as a p-type semiconductor region having a high impurity concentration. Accordingly, the vertical transfer register portion 3 in the vertical OPB portion 5V is strongly influenced by three-dimensional compression (clamping) from the dense p-type semiconductor region, so that the dynamic range of the vertical transfer register portion 3 in the vertical OPB portion 5V becomes smaller than the dynamic range of the vertical transfer register portion 3 in the effective pixel region 4.

This problem will now be described in more detail.

As shown in FIG. 17, the n-type semiconductor region 14 (see FIG. 15) is not formed at the portion 10 in the vertical OPB portion 5V corresponding to the photosensor portion 2 in the effective pixel region 4. Accordingly, the impurity concentration in the $p^{++}$ positive charge storage region 15 formed by ion implantation is high, and the p-type impurity in the region 15 is diffused into the n-type transfer channel region 17. As a result, the effective channel width of the n-type transfer channel region 17 tends to be smaller than the channel width of the n-type transfer channel region 17 in the effective pixel region 4. On the other hand, the n-type semiconductor region 14 is present at the photosensor portion 2 in the effective pixel region 4, so that the impurity in the $p^{++}$ positive charge storage region 15 is recombined in a certain amount with the impurity in the n-type semiconductor region 14. As a result, the impurity concentration in the $p^{++}$ positive charge storage region 15 decreases by the certain amount, and has no influence upon the n-type transfer channel region 17.

FIG. 18 is a diagram showing a potential along the depth of the vertical transfer register portion 3 (along the line D–D' in FIG. 15) in the effective pixel region 4 at the time of normal operation. In this case, a substrate voltage $V_{sub}$ is applied to the substrate 12. FIG. 19 is a diagram showing a potential along the depth of the vertical transfer register portion 3 in the effective pixel region 4 at the time of electronic shuttering. In this case, an electronic shuttering pulse $\phi s$ having a positive high amplitude as shown in FIG. 21 is superimposed on the substrate voltage $V_{sub}$ and applied to the substrate 12.

FIG. 20 is a diagram showing a potential along the depth of the vertical transfer register portion 3 (along the line F–F' in FIG. 17) in the vertical OPB portion 5V at the time of electronic shuttering.

When the electronic shuttering pulse $\phi s$ having a positive high amplitude plus the substrate potential $V_{sub}$ is applied to the substrate 12 as shown in FIGS. 19 and 20, an apparent GND potential is shifted toward positive potentials by the influence of coupling capacities C formed between the substrate 12 and the p-type regions as shown in FIGS. 15 and 17. Furthermore, the potentials in the p-type regions capacitively coupled to the substrate 12, i.e., the potential in the first p-type semiconductor well region 13 in the effective pixel region 4 and the potentials in the first and second p-type semiconductor well regions 13 and 16 in the vertical OPB portion 5V, transitionally becomes deep, causing a reduction in charge storage capacity (so-called maximum handling charge amount) of the vertical transfer register portion 3. In particular, the charge storage capacity in the vertical OPB portion 5V is most reduced at shown in FIG. 20.

This is due to the fact that the portion 10 in the vertical OPB portion 5V corresponding to the photosensor portion 2 in the effective pixel region 4 is formed by the $p^{++}$ positive charge storage region 15 having a high impurity concentration as shown in FIG. 17, and that the coupling capacity C between the substrate 12 and the region 15 is therefore larger, causing a large influence on the potential at the time of application of the electronic shuttering pulse $\phi s$. As a result, the charge storage capacity of the vertical transfer register portion 3 in the vertical OPB portion 5V is most reduced.

SUMMARY OF THE INVENTION

It is accordingly an object of the present invention to provide a solid-stage imaging device which can be improved in general dynamic range.

In accordance with an aspect of the present invention, there is provided a solid-state imaging device having an effective pixel portion, an optical black portion, and a charge transfer register portion commonly provided in the effective pixel portion and the optical black portion, wherein the register width of a portion of the charge transfer register portion in the optical black portion is set larger than the register width of a portion of the charge transfer register portion in the effective pixel portion.

With this configuration, the register width of the charge transfer register portion in the optical black portion is larger than the register width of the charge transfer register portion in the effective pixel portion. Accordingly, a charge storage capacity at the charge transfer register portion in the optical black portion can be increased, so that even when a potential at the charge transfer register portion varies at the time of electronic shuttering, a sufficient charge storage capacity can be ensured. Accordingly, the general dynamic range in the solid-state imaging device can be increased.

In accordance with another aspect of the present invention, there is provided a solid-state imaging device having an effective pixel portion, an optical black portion, and a charge transfer register portion commonly provided in the effective pixel portion and the optical black portion, wherein the area of a portion in the optical black portion corresponding to a unit sensor portion in the effective pixel portion is set smaller than the area of the unit sensor portion in the effective pixel portion.

With this configuration, the area of the portion in the optical black portion corresponding to the unit sensor portion in the effective pixel portion is reduced. As a result, the distance between this portion corresponding to the unit sensor portion and the charge transfer register portion is increased. Accordingly, it is possible to reduce the influence of a coupling capacity between this portion corresponding to the unit sensor portion and the substrate upon the charge transfer register portion especially at the time of electronic shuttering, thereby suppressing variations in potential at the charge transfer register portion. Accordingly, the general dynamic range in the solid-stage imaging device can be increased.

Other objects and features of the invention will be more fully understood from the following detailed description and appended claims when taken with the accompanying drawings.

DETAILED DESCRIPTION OF THE PREFERRED EMBODIMENTS

FIGS. 1 to 4 show a first preferred embodiment of the CCD solid-state imaging device according to the present invention.

This CCD solid-state imaging device adopts a so-called vertical overflow drain structure.

Figure 1:
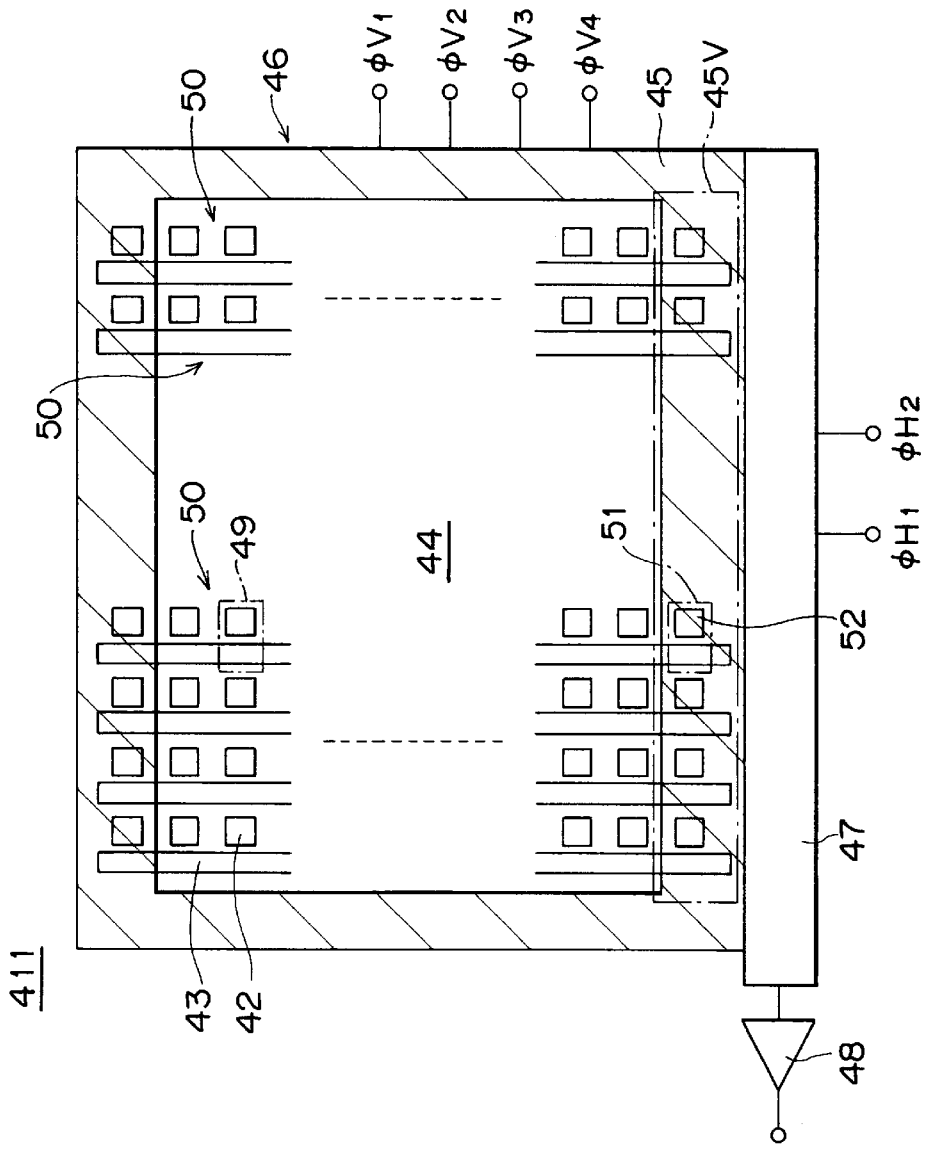
FIG. 1 is a schematic view showing the general configuration of a first preferred embodiment of the solid-state imaging device according to the present invention.

Referring to FIG. 1, reference numeral 411 generally denotes a CCD solid-state imaging device according to the first preferred embodiment of the present invention. The CCD solid-state imaging device 411 has an imaging region 46 composed of an effective pixel region 44 and an OPB portion 45 for detecting a black level. The effective pixel region 44 has a plurality of photosensor portions 42 arranged in the form of matrix. Each photosensor portion 42 is formed by a photodiode for performing opto-electric conversion of incident light. The effective pixel region 44 further has a plurality of charge transfer registers each having a CCD structure, i.e., so-called vertical transfer register portions 43 respectively corresponding to the columns of the photosensor portions 42 in such a manner that each vertical transfer register portion 43 extends along one side of the corresponding column of the photosensor portions 42. The OPB portion 45 is formed around the effective pixel region 44 as shown by the hatching in FIG. 1 so as to be shielded by a light shielding film which will be hereinafter described. The solid-state imaging device 411 further has a charge transfer register having a CCD structure, i.e., so-called horizontal transfer register portion 47 and a charge detecting portion 48 connected to the output of the horizontal transfer register portion 47.

Reference numeral 49 denotes a unit effective pixel in the effective pixel region 44. The unit effective pixels 49 of each column constitute an effective pixel portion 50.

The OPB portion 45 has a vertical OPB portion 45V formed in a vertically extended region of the effective pixel portion 50 of each column.

The vertical OPB portion 45V has a portion 52 corresponding to the photosensor portion 42. This portion 52 and a transfer portion corresponding to one bit of the vertical transfer register portion 43 constitute a unit optical black pixel 51.

The effective pixel portion 50 and the vertical OPB portion 45V of the same column commonly have the same vertical transfer register portion 43.

Figure 2:
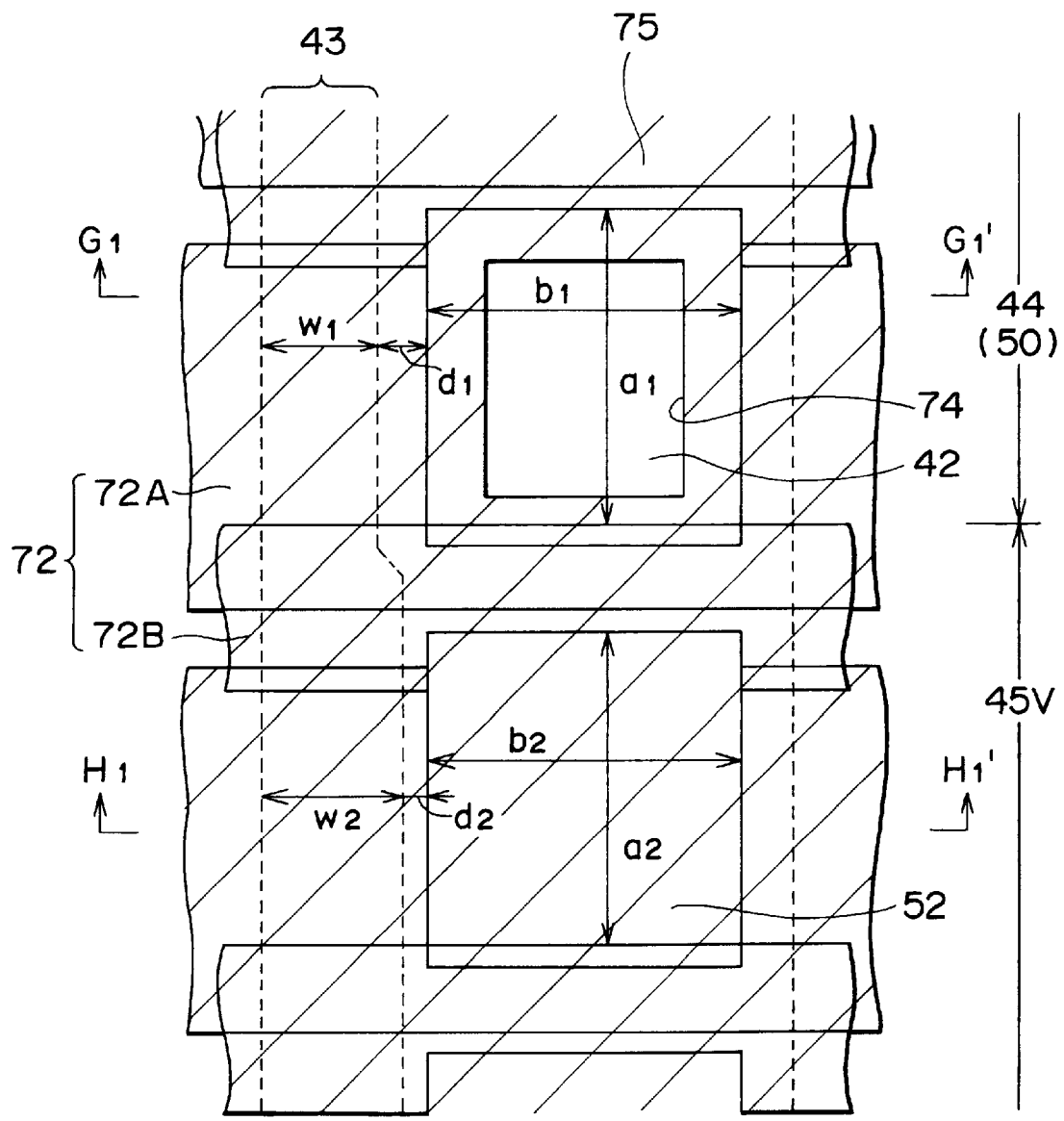
FIG. 2 is an enlarged plan view of an essential part shown in FIG. 1.

As shown in FIG. 2, a portion of the vertical transfer register portion 43 in the effective pixel region 44, i.e., the effective pixel portion 50, has a register width $W_1$, and a portion of the vertical transfer register portion 43 in the vertical OPB portion 45V has a register width $W_2$. The register width $W_2$ is set larger than the register width $W_1$ (i.e., $W_1 < W_2$). That is, the register width $W_2$ is obtained by increasing the width of the vertical transfer register portion 43 toward a reading gate portion 54.

The area ($= a_1 \times b_1$) of the photosensor portion 42 in the effective pixel portion 50 is equal to the area ($= a_2 \times b_2$) of the portion 52 in the vertical OPB portion 45V. The reading gate portion 54 in each effective pixel has a gate length $d_1$, and the reading gate portion 54 in each optical black pixel has a gate length $d_2$. The gate length $d_2$ is set smaller than the gate length $d_1$. The above conditions may be applied only to the vertical OPB portion 45V in the charge transfer direction of the vertical transfer register portion 43.

Figure 3:
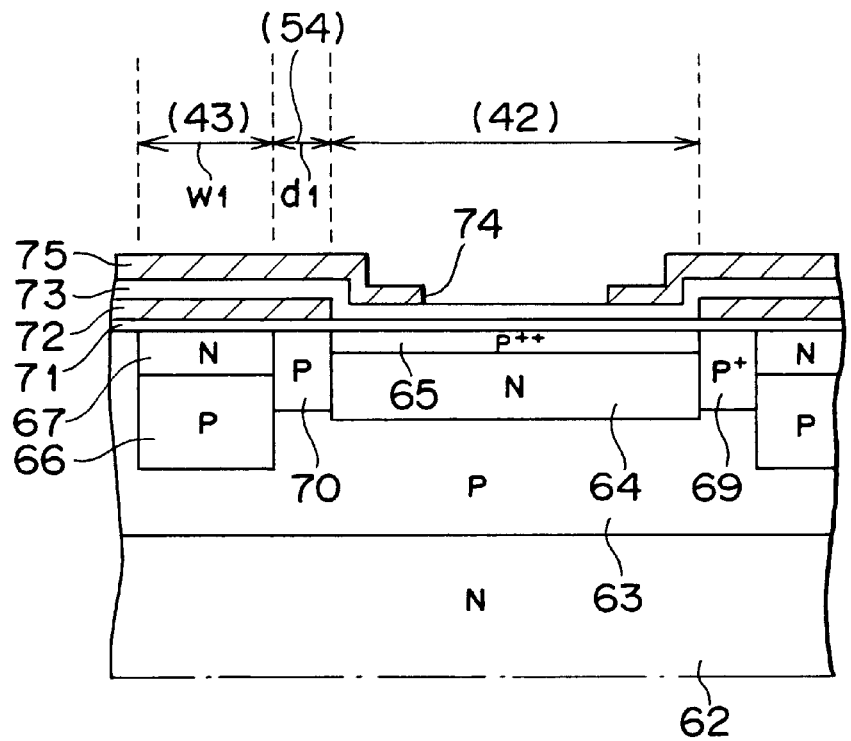
FIG. 3 is a cross section taken along the line $G_1$–$G_1'$ in FIG. 2.

FIG. 3 shows a sectional structure of the effective pixel region 44 as taken along the line $G_1$–$G_1'$ in FIG. 2, and FIG.

4 shows a sectional structure of the vertical OPB portion 45V as taken along the line $H_1$–$H_1'$ in FIG. 2.

Figure 14:
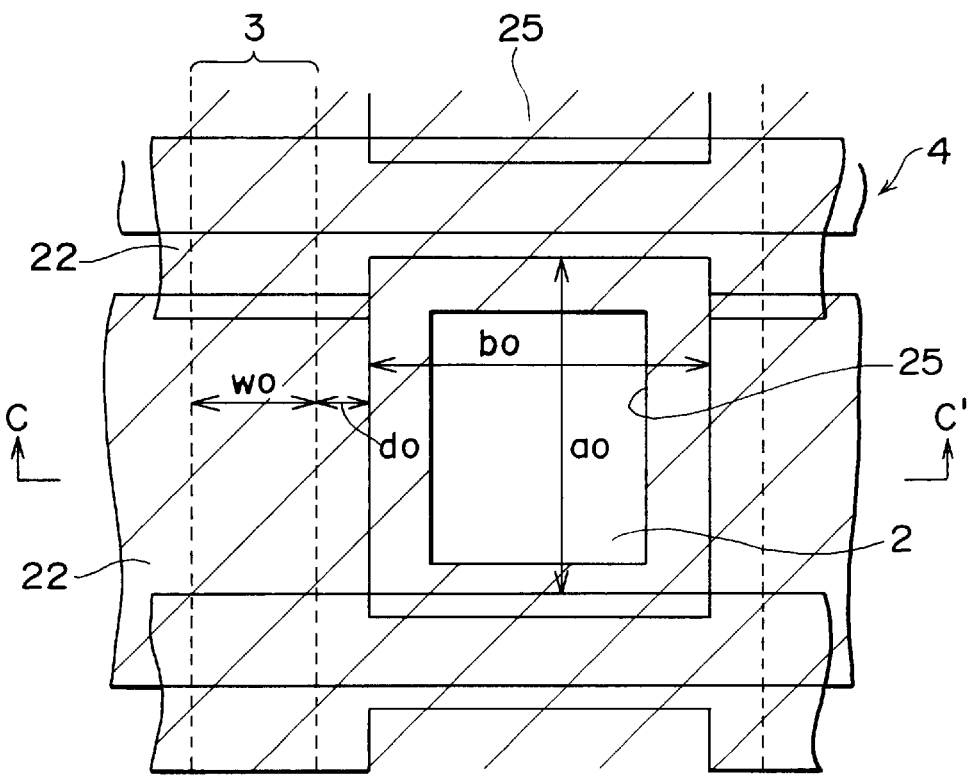
FIG. 14 is an enlarged plan view of an effective pixel portion shown in FIG. 13.
Figure 15:
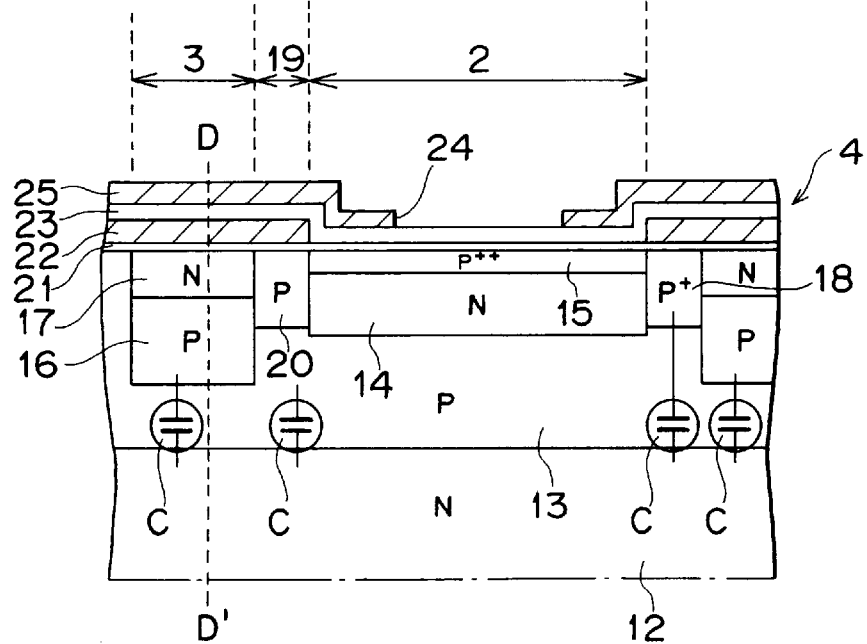
FIG. 15 is a cross section taken along the line C–C' in FIG. 14.

As shown in FIG. 3, the effective pixel region 44 has a sectional structure similar to that in the conventional structure shown in FIGS. 14 and 15. That is, a silicon substrate 62 of first conduction type, e.g., n-type, is provided, and a first semiconductor well region 63 of second conduction type, i.e., p-type, is formed on the silicon substrate 62. An n-type semiconductor region 64 is formed on the upper surface of the first p-type semiconductor well region 63, and a $p^{++}$ positive charge storage region 65 is formed on the upper surface of the n-type semiconductor region 64, so as to form the photosensor portion 42.

A second p-type semiconductor well region 66 and an n-type transfer channel region 67 are formed in the first p-type semiconductor well region 63 at a position separate from the photosensor portion 42. A p-type channel stop region 69 is also formed in the first p-type semiconductor well region 63. The photosensor portion 42 as a so-called HAD sensor is formed by the first p-type semiconductor well region 63, the n-type semiconductor region 64, and the $p^{++}$ positive charge storage region 65.

The first p-type semiconductor well region 63 functions as a so-called overflow barrier region, and the substrate 62 functions as a so-called overflow drain region, thus forming a vertical overflow drain structure.

The reading gate portion 54 is formed between the photosensor portion 42 and the vertical transfer register portion 43 to be hereinafter described. A p-type semiconductor region 70 is formed in the surface of the substrate at a position corresponding to the reading gate portion 54.

A transfer electrode 72 of polysilicon, for example, is formed through a gate insulating film 71 on the transfer channel region 67, the channel stop region 69, and the p-type semiconductor region 70 of the reading gate portion 54. The vertical transfer register portion 43 having a CCD structure is formed by the transfer channel region 67, the gate insulating film 71, and the transfer electrode 72. As shown in FIG. 2, the transfer electrode 72 has a two-layer structure consisting of electrodes 72A and 72B, for example.

An interlayer dielectric 73 is formed so as to cover the transfer electrode 72, and a light shielding film 75 such as an Al film is formed on the entire surface except an opening 74 of the photosensor portion 42.

Figure 4:
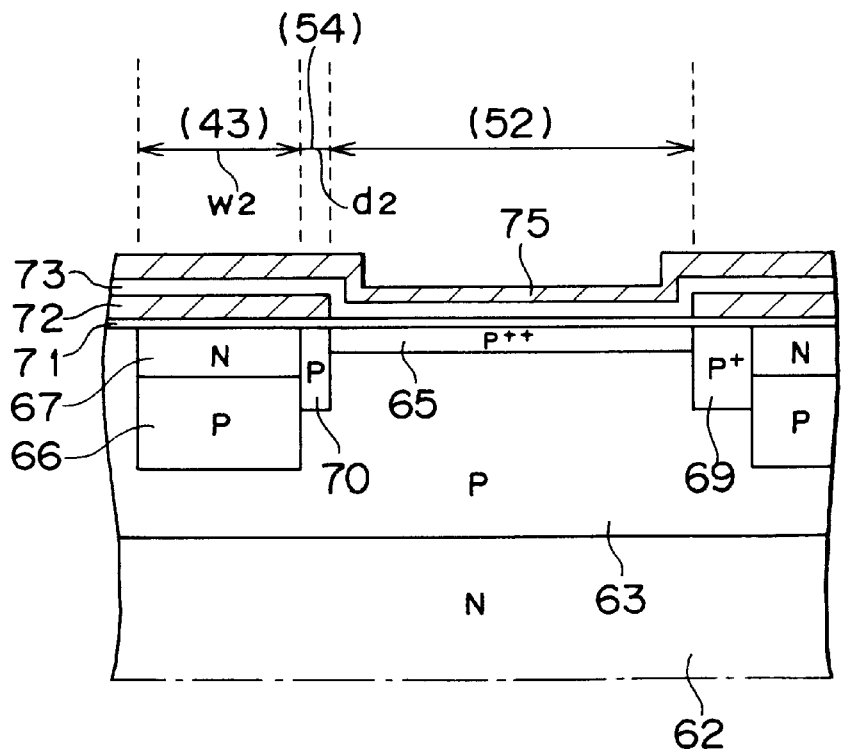
FIG. 4 is a cross section taken along the line $H_1$–$H_1'$ in FIG. 2.
Figure 16:
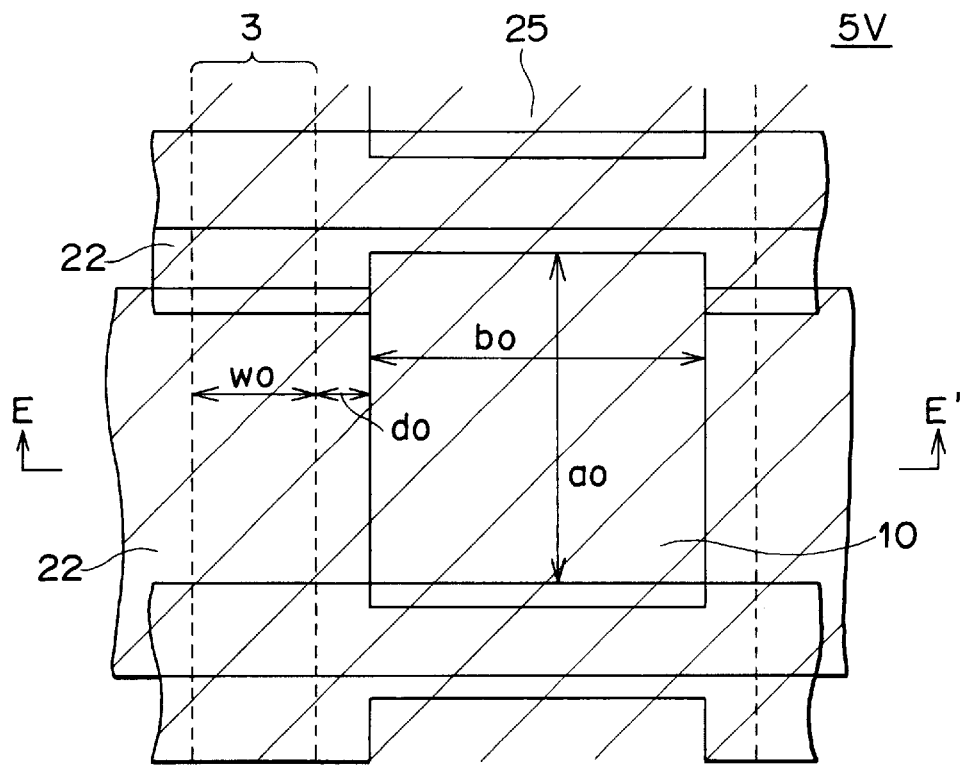
FIG. 16 is an enlarged plan view of a vertical optical black portion shown in FIG. 13.
Figure 17:
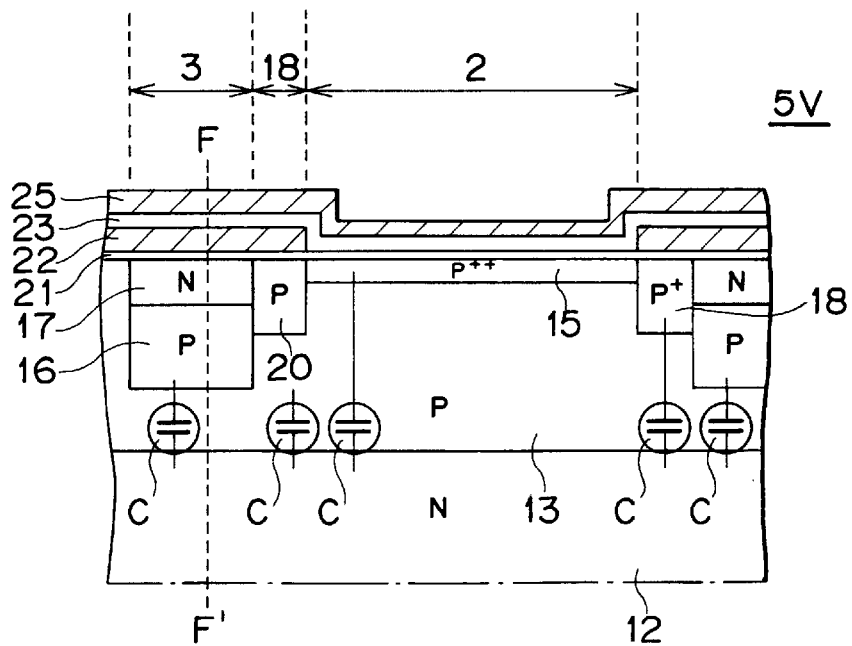
FIG. 17 is a cross section taken along the line E–E' in FIG. 16.
Figure 18:
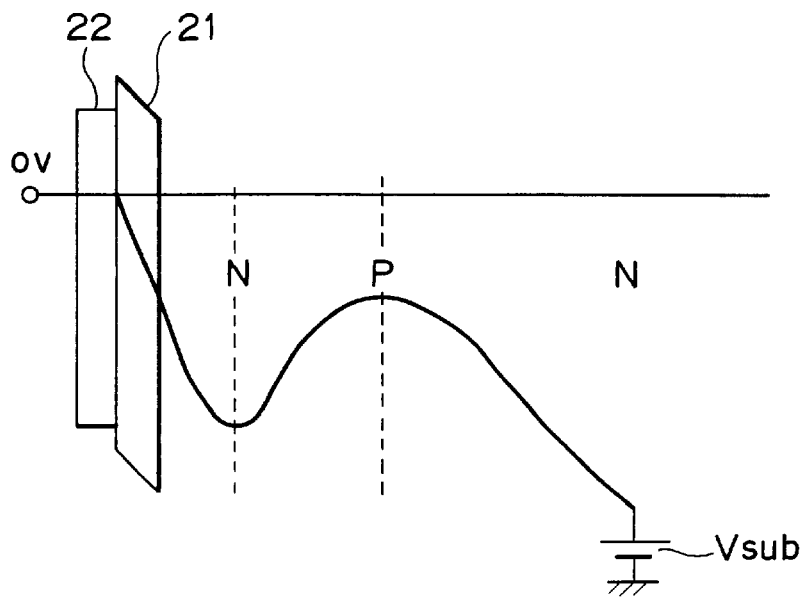
FIG. 18 is a diagram showing a potential along the depth of a vertical transfer register portion (along the line D–D' in FIG. 15) in the effective pixel region at the time of normal operation.
Figure 19:
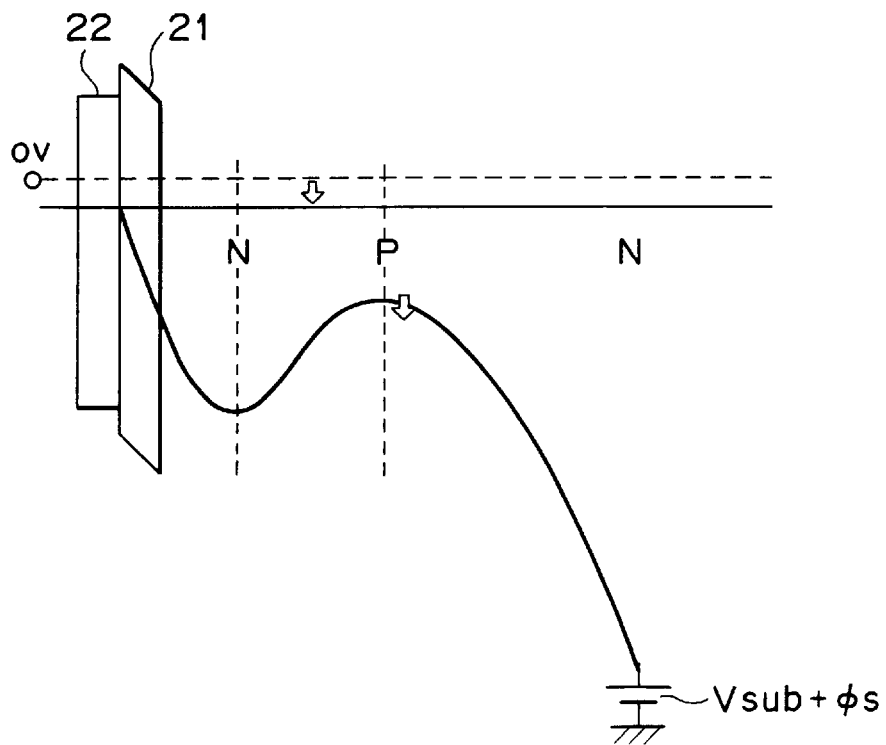
FIG. 19 is a diagram showing a potential along the depth of a vertical transfer register portion (along the line D–D' in FIG. 15) in the effective pixel region at the time of electronic shuttering.

As shown in FIG. 4, the vertical OPB portion 45V also has a sectional structure similar to that of the conventional structure shown in FIGS. 16 and 17. That is, the n-type semiconductor region 64 is not formed at the portion 52 corresponding to the photosensor portion 42, but only the $p^{++}$ positive charge storage region 65 is formed on the upper surface of the first p-type semiconductor well region 63 at the portion 52. Thus, no photodiode is formed at the portion 52. Further, the light shielding film 75 is formed on the entire surface including the portion 52.

The other configuration is similar to that of the effective pixel region 44, so the corresponding parts are denoted by the same reference numerals and the description thereof will be omitted herein to avoid repetition.

Figure 21:
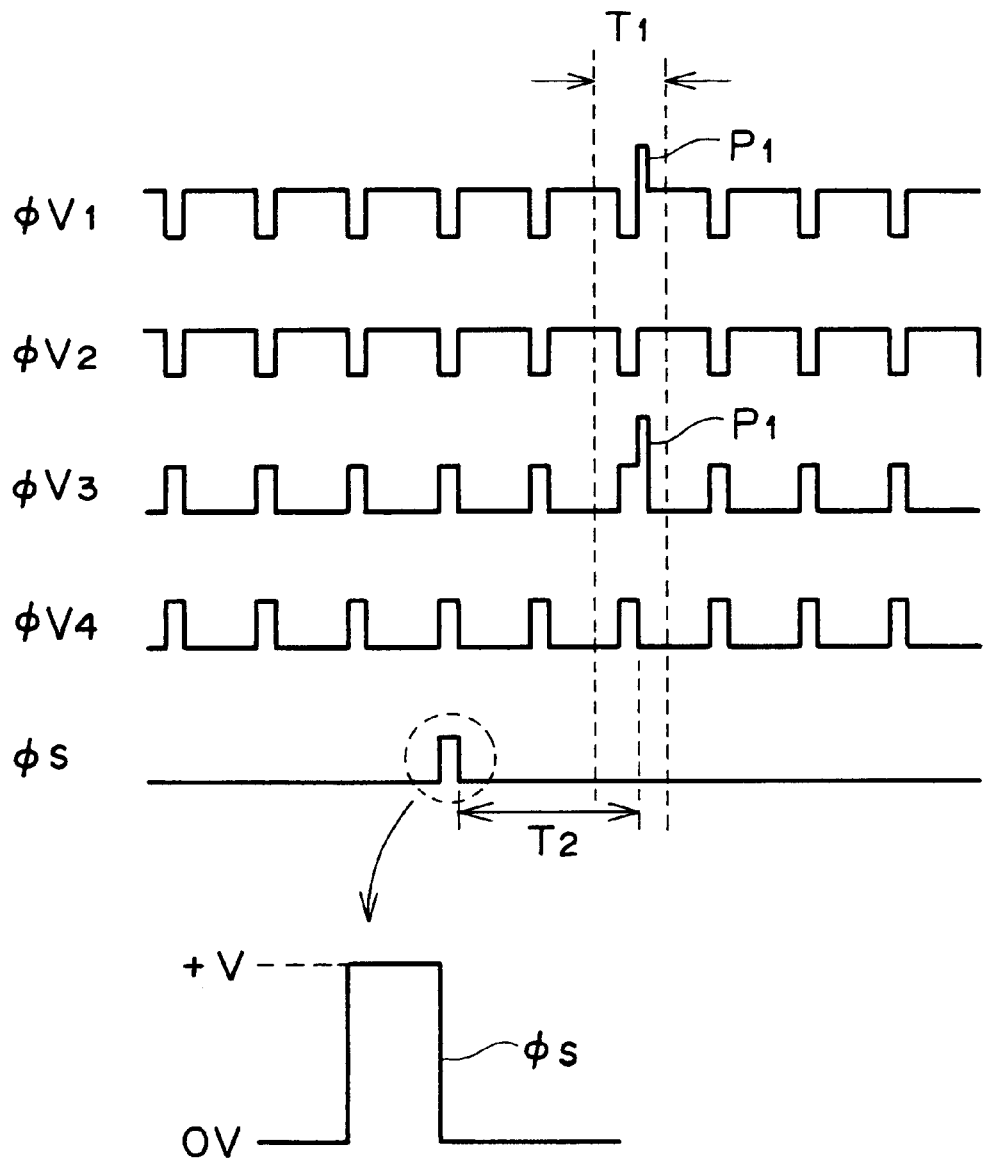
FIG. 21 is a timing chart of driving pulses for the solid-state imaging device.

In the solid-state imaging device 411, signal charge obtained by opto-electric conversion at the photosensor portion 42 in the effective pixel region 44 and charge at the vertical OPB portion 45V are read to the vertical transfer register portion 43 at given periods, and then transferred toward the horizontal transfer register portion 47 by four-phase vertical driving clock pulses $\phi V_1$, $\phi V_2$, $\phi V_3$, and $\phi V_4$ shown in FIG. 21, for example. In the horizontal transfer register portion 47, the charge at the vertical OPB portion 45V and the signal charge at the photosensor portion 42 both transferred from the vertical transfer register portion 43 are sequentially fed to the charge detecting portion 48 bit by bit by two-phase horizontal driving clock pulses $\phi H_1$ and $\phi H_2$. In the charge detecting portion 48, the input charge is converted into voltage, which is then output as a voltage signal. In the vertical OPB portion 45V, no incident light is received and no opto-electric conversion is therefore performed. Accordingly, no charge is actually read out and a black-level signal is therefore output from the charge detecting portion 48.

According to the CCD solid-state imaging device 411 of the first preferred embodiment, the register width $W_2$ of the vertical transfer register portion 43 in the vertical OPB portion 45V is set larger than the register width $W_1$ of the vertical transfer register portion 43 in the effective pixel portion 50, so that a charge storage capacity (so-called maximum handling charge amount) of the vertical transfer register portion 43 in the vertical OPB portion 45V can be partially increased.

That is, at a portion where the dynamic range of the solid-state imaging device is locally most determined (at the vertical transfer register portion 43 in the vertical OPB portion 45V), the charge storage capacity can be increased.

Figure 20:
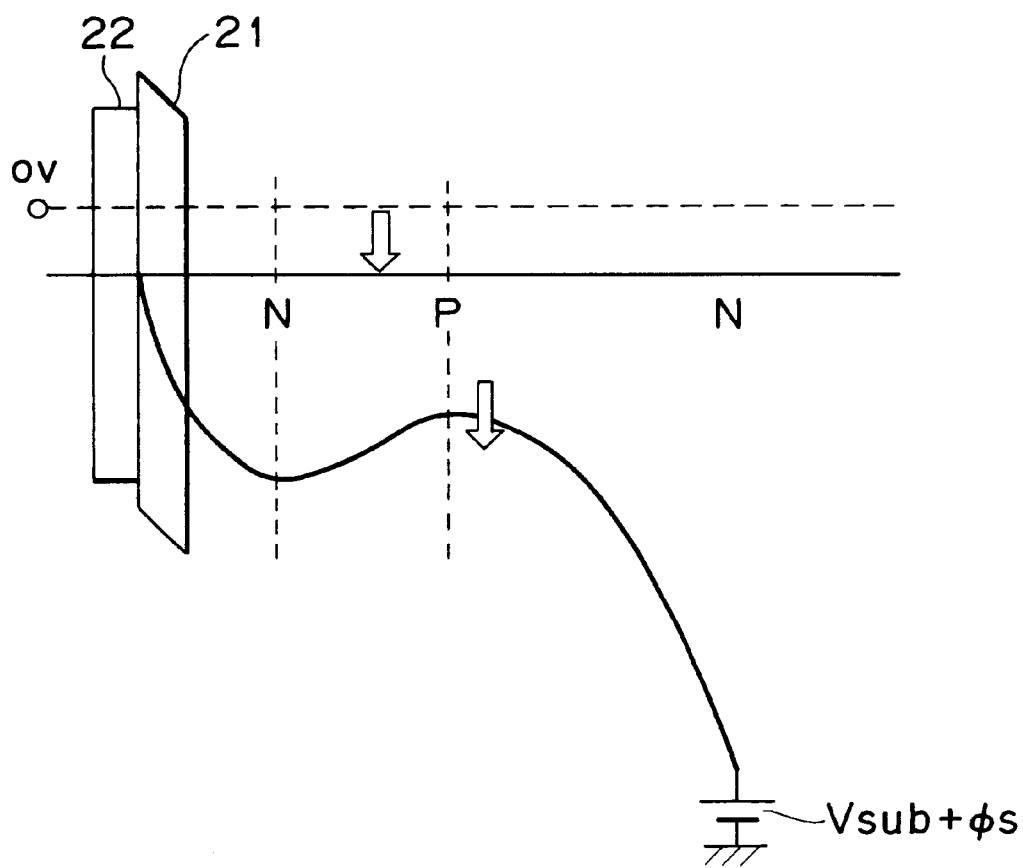
FIG. 20 is a diagram showing a potential along the depth of a vertical transfer register portion (along the line F–F' in FIG. 17) in the vertical OPB portion at the time of electronic shuttering.

Accordingly, even when the potential at the transfer portion of the vertical transfer register portion 43 in the vertical OPB portion 45V varies as shown in FIG. 20 especially at the time of electronic shuttering, a sufficient charge storage capacity can still be obtained, so that the general dynamic range in the solid-state imaging device 411 can be improved. Further, even when the p-type impurity in the $p^{++}$ positive charge storage region 65 formed by ion implantation is diffused into the n-type transfer channel region 67 in the vertical OPB portion 45V, an effective register width of the vertical transfer register portion 43 can be sufficiently ensured because the n-type transfer channel width is large.

In the vertical OPB portion 45V, no charge reading from the portion 52 corresponding to the photosensor portion 42 is substantially carried out. Accordingly, the register width $W_2$ can be expanded toward the reading gate portion 54, and the other characteristics are not largely influenced by the expansion of the register width $W_2$.

With the configuration of this preferred embodiment, the sensitivity linear characteristic can be improved, and both the sensitivity and the S/N ratio can also be improved.

FIGS. 5 to 8 show a second preferred embodiment of the CCD solid-state imaging device according to the present invention.

Figure 5:
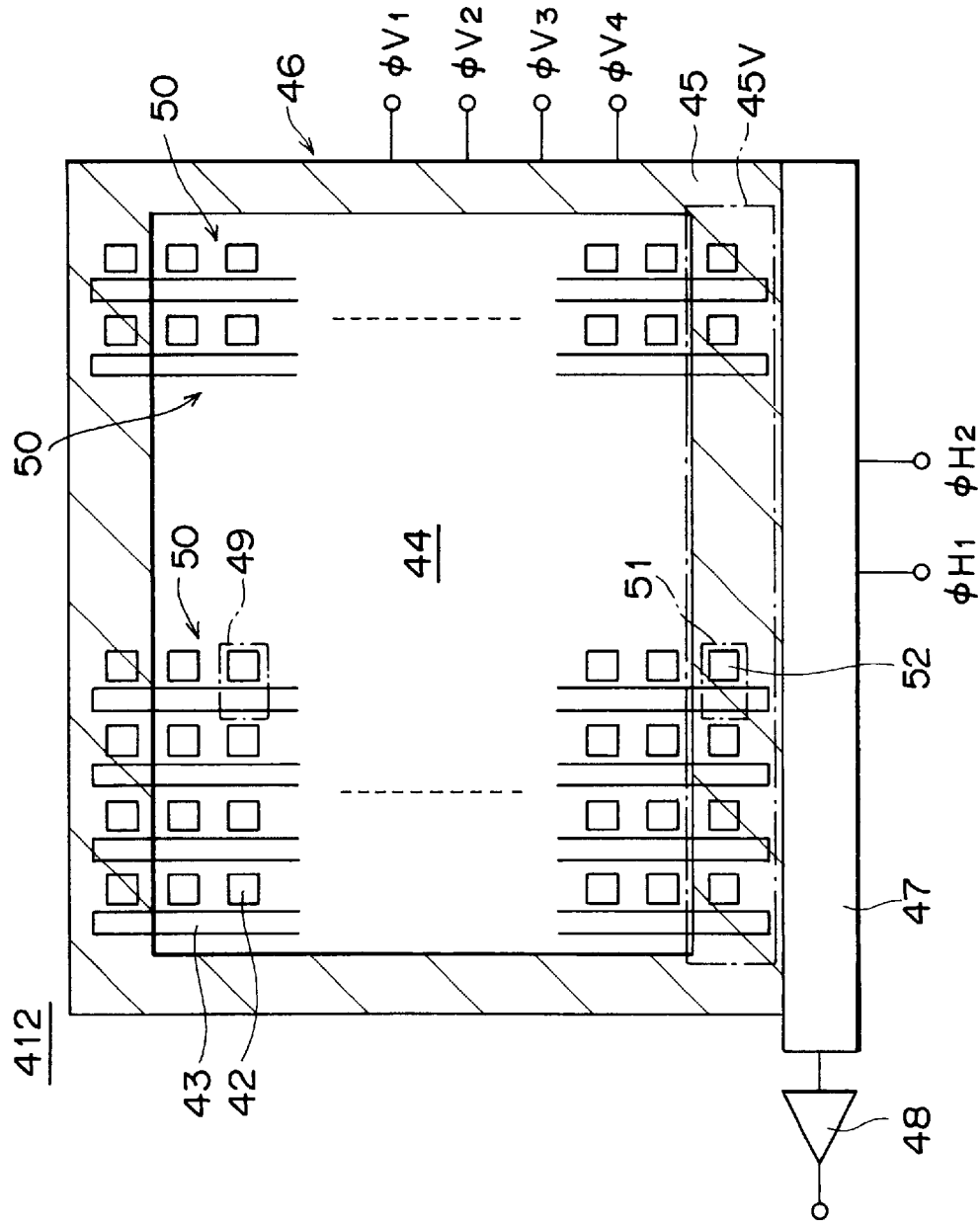
FIG. 5 is a schematic view showing the general configuration of a second preferred embodiment of the solid-state imaging device according to the present invention.
Figure 6:
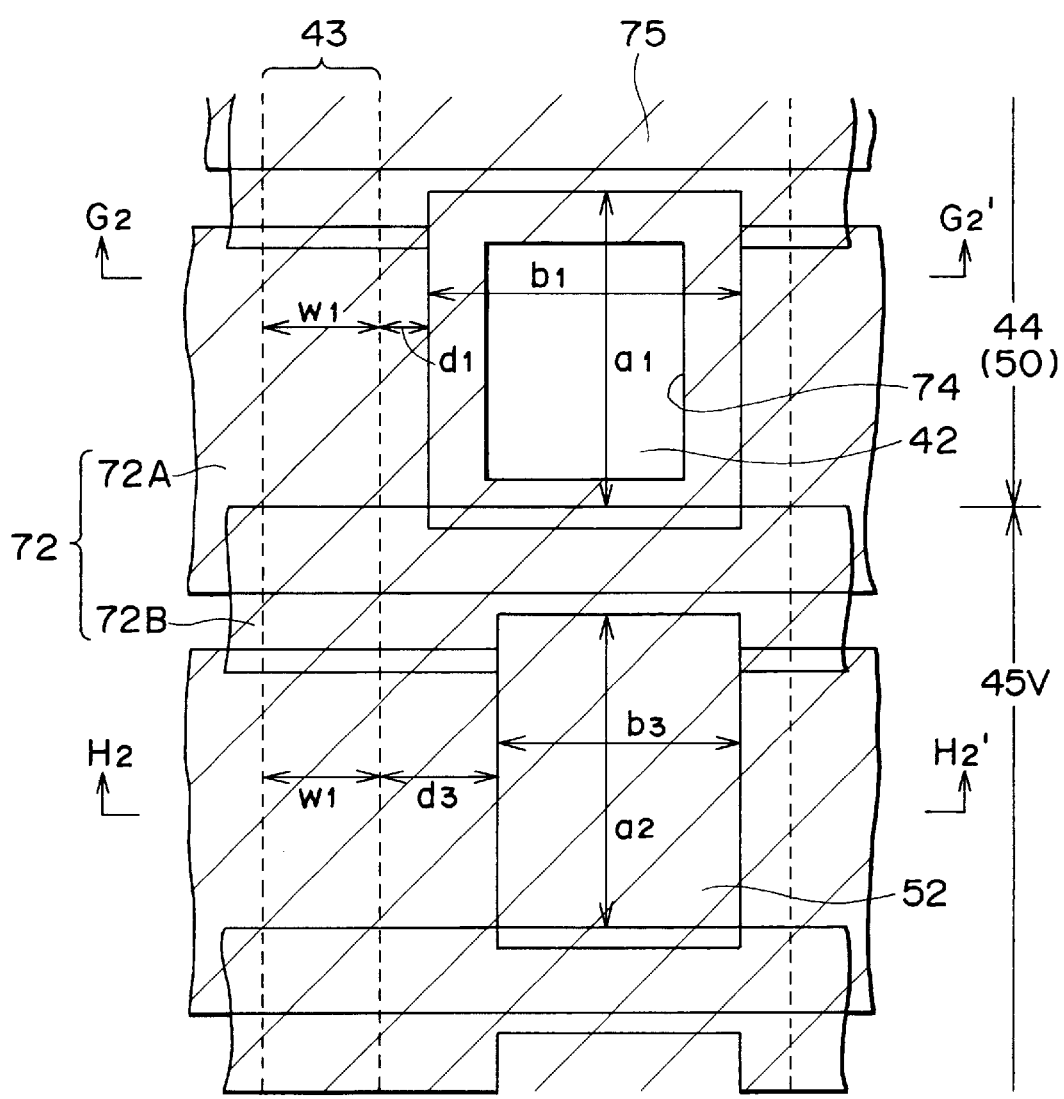
FIG. 6 is an enlarged plan view of an essential part shown in FIG. 5.
Figure 7:
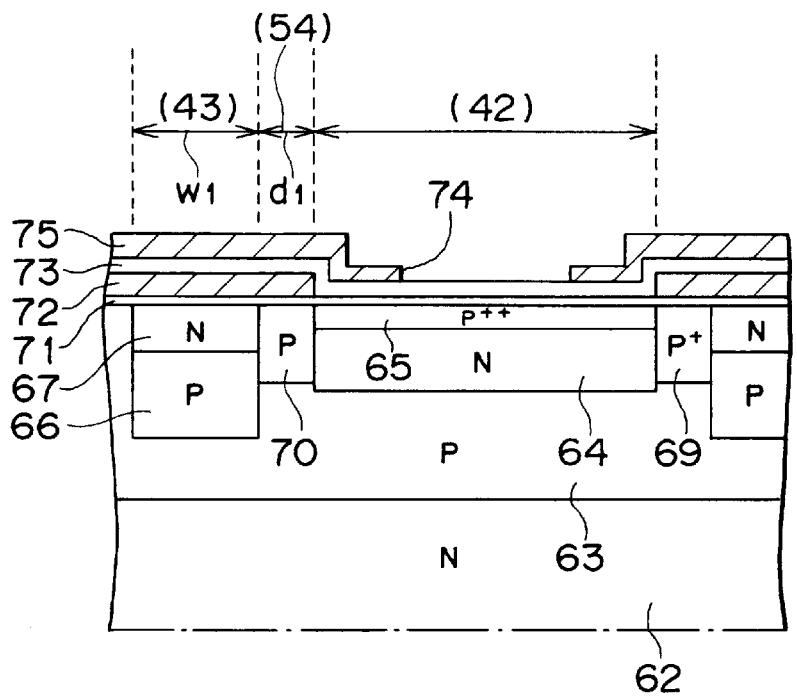
FIG. 7 is a cross section taken along the line $G_2$–$G_2'$ in FIG. 6.
Figure 8:
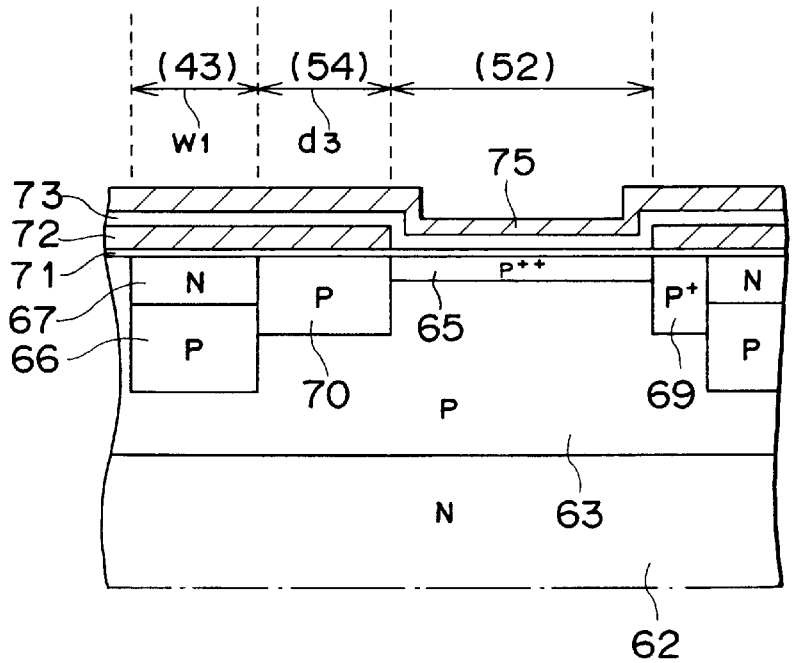
FIG. 8 is a cross section taken along the line $H_2$–$H_2'$ in FIG. 6.

FIG. 5 is a schematic view showing the general configuration of the second preferred embodiment, FIG. 6 is an enlarged plan view of an essential part (effective pixel portion and vertical OPB portion) of the second preferred embodiment, FIG. 7 is a cross section taken along the line $G_2$–$G_2'$ in FIG. 6, and FIG. 8 is a cross section taken along the line $H_2$–$H_2'$ in FIG. 6.

Referring to FIG. 5, reference numeral 412 generally denotes a solid-state imaging device according to the second preferred embodiment. In each column of pixels, the area ($=a_2 \times b_3$) of a portion 52 in a vertical OPB portion 45V corresponding to a photosensor portion 42 in an effective pixel region 44, accordingly, an effective pixel portion 50 is set smaller than the area ($=a_1 \times b_1$) of the photosensor portion 42 in the effective pixel portion 50.

Particularly, $a_1 = a_2$ and $b_1 > b_3$, thereby reducing the area of the portion 52 in the vertical OPB portion 45V corresponding to the photosensor portion 42 in the effective pixel portion 50.

The register width of a vertical transfer portion 43 is set to a uniform width $W_1$. That is, the register width of a portion of the vertical transfer register portion 43 in the effective pixel portion 50 is set to $W_1$, and the register width of a portion of the vertical transfer register portion 43 in the vertical OPB portion 45V is set also to $W_1$.

Accordingly, the gate length $d_3$ of a reading gate portion 54 in the vertical OPB portion 45V is larger than the gate length $d_1$ of a reading gate portion 54 in the effective pixel portion 50 (i.e., $d_1 < d_3$).

The other configuration is similar to that shown in FIGS. 1 to 4, so the corresponding parts are denoted by the same reference numerals and the description thereof will be omitted herein to avoid repetition.

According to the CCD solid-state imaging device 412 according to the second preferred embodiment, the area of the portion 52 in the vertical OPB portion 45V corresponding to the photosensor portion 42 is set smaller than the area of the photosensor portion 42 in the effective pixel portion 50, thereby setting the gate length $d_3$ of the reading gate portion 54 between the portion 52 and the vertical transfer register portion 43 larger than the gate length $d_1$ of the reading gate portion 54 between the photosensor portion 42 and the vertical transfer register portion 43. As a result, the distance between the $p^{++}$ positive charge storage region 65 in the vertical OPB portion 45V and the vertical transfer register portion 43 can be increased.

Accordingly, it is possible to reduce the influence of a coupling capacity C between the $p^{++}$ positive charge storage region 65 and the substrate 62 upon the vertical transfer register portion 43 at the time of electronic shuttering.

As a result, a sufficient charge storage capacity can be obtained at the transfer portion of the vertical transfer register portion 43 in the vertical OPB portion 45V. That is, it is possible to obtain a charge storage capacity similar to that at the transfer portion of the vertical transfer register portion 43 in the effective pixel portion 50.

The distance between the portion 52 and the vertical transfer register portion 43, i.e., the gate length $d_3$ of the reading gate portion 54 in the vertical OPB portion 45V is larger than that ($=d_1$) in the effective pixel portion 50. Accordingly, the diffusion of the p-type impurity in the $p^{++}$ positive charge storage region 65 formed by ion implantation into the n-type transfer channel region 67 can be suppressed in the vertical OPB portion 45V, so that the channel width of the n-type transfer channel region 67, i.e., the register width $W_1$ is not substantially reduced.

Accordingly, the dynamic range in the transfer portion of the vertical transfer register portion 43 in the vertical OPB portion 45V can be increased to thereby improve the general dynamic range in the solid-state imaging device 412.

Further, like the first preferred embodiment, the sensitivity linear characteristic can be improved, and both the sensitivity and the S/N ratio can also be improved.

Also in this preferred embodiment, no charge reading from the portion 52 in the vertical OPB portion 45V corresponding to the photosensor portion 42 is substantially carried out, so that the reduction in the area of the portion 52 has little influence upon the other characteristics.

FIGS. 9 to 12 show a third preferred embodiment of the CCD solid-state imaging device according to the present invention.

Figure 9:
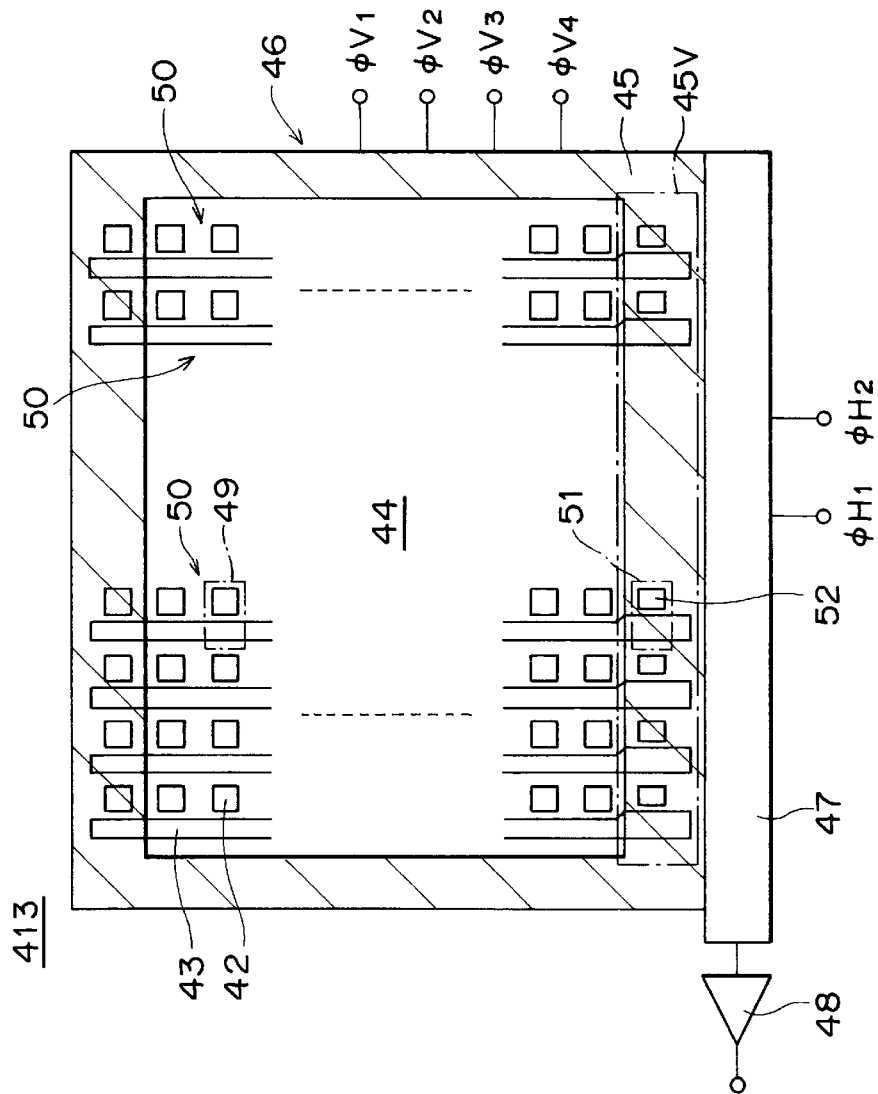
FIG. 9 is a schematic view showing the general configuration of a third preferred embodiment of the solid-state imaging device according to the present invention.
Figure 10:
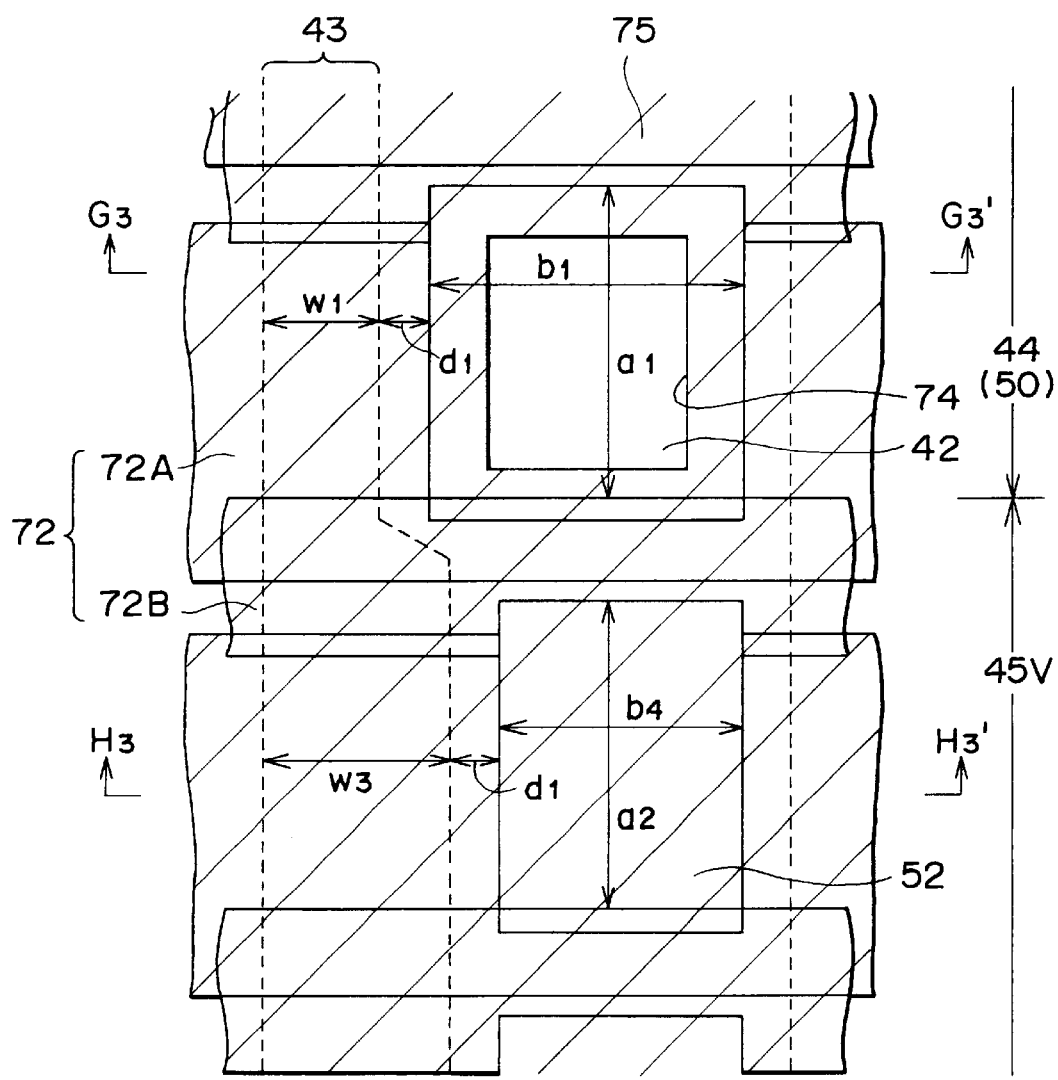
FIG. 10 is an enlarged plan view of an essential part shown in FIG. 9.
Figure 11:
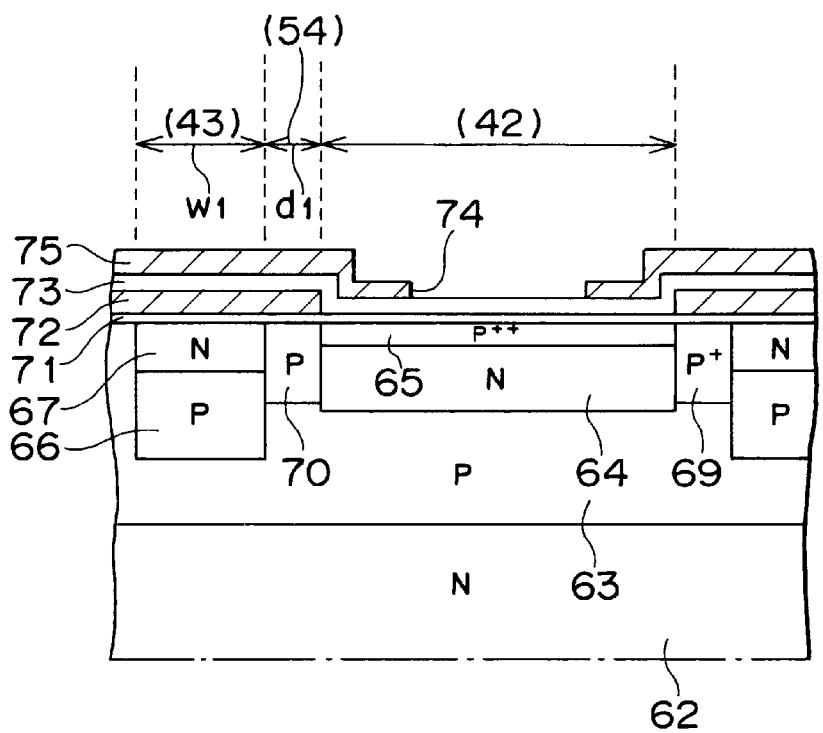
FIG. 11 is a cross section taken along the line $G_3$–$G_3'$ in FIG. 10.
Figure 12:
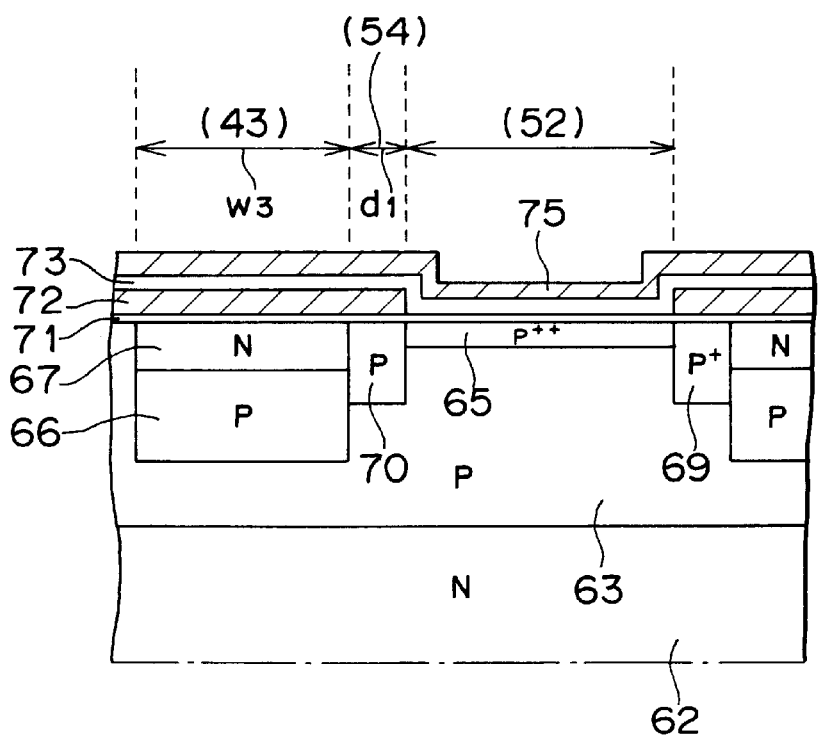
FIG. 12 is a cross section taken along the line $H_3$–$H_3'$ in FIG. 10.
Figure 13:
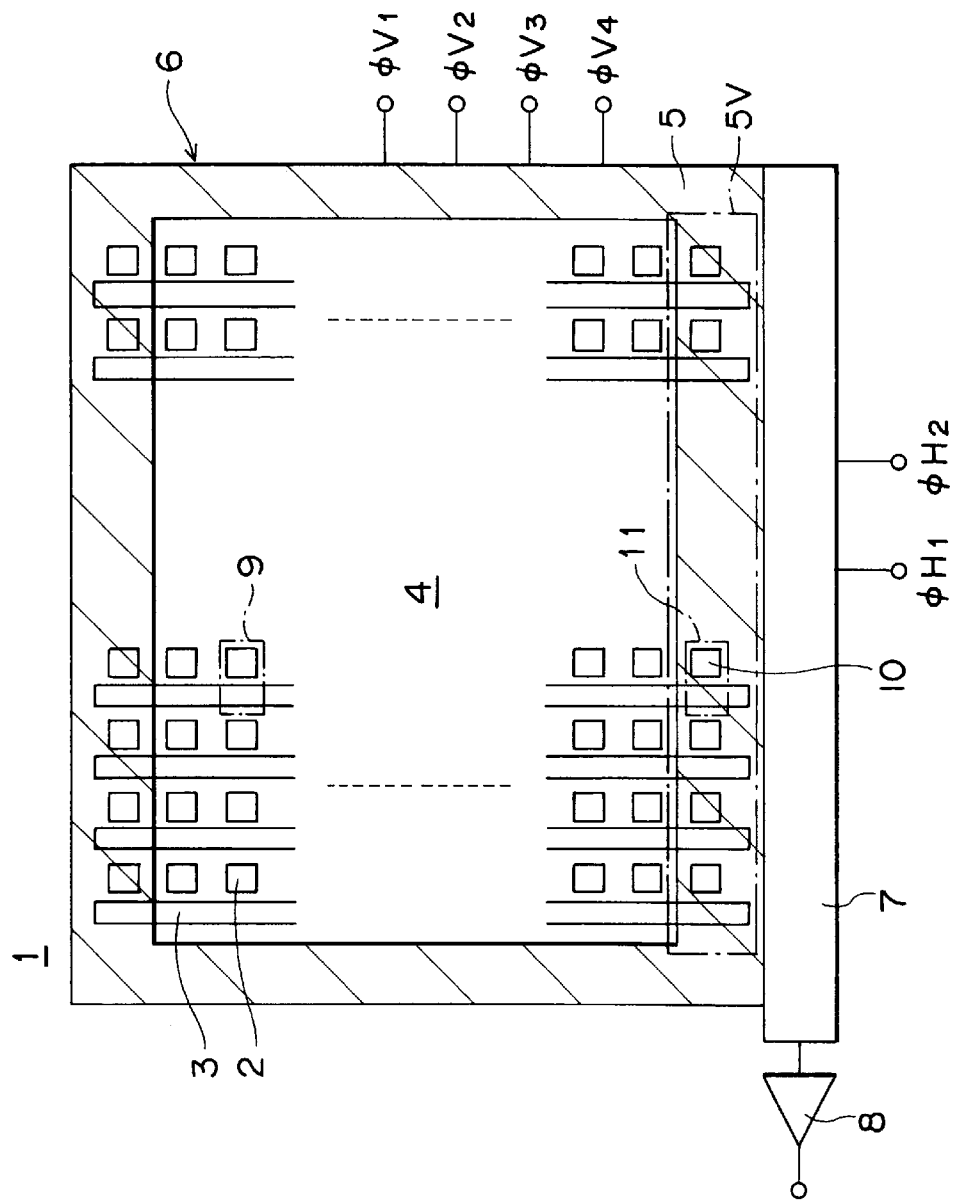
FIG. 13 is a schematic view showing the general configuration of a conventional solid-state imaging device.

FIG. 9 is a schematic view showing the general configuration of the third preferred embodiment, FIG. 10 is an enlarged plan view of an essential part (effective pixel portion and vertical OPB portion) of the third preferred embodiment, FIG. 11 is a cross section taken along the line $G_3$–$G_3'$ in FIG. 10, and FIG. 12 is a cross section taken along the line $H_3$–$H_3'$ in FIG. 10.

Referring to FIG. 9, reference numeral 413 generally denotes a solid-state imaging device according to the third preferred embodiment. In this preferred embodiment, the register width $W_3$ of a portion of the vertical transfer register portion 43 in the vertical OPB portion 45V is expanded toward the reading gate portion 54 so that the register width $W_3$ is set larger than the register width $W_1$ of a portion of the vertical transfer register portion 43 in the effective pixel region 44, i.e., the effective pixel portion 50 (i.e., $W_1 < W_3$). Further, in each column of pixels, the area ($=a_2 \times b_4$) of a portion 52 in the vertical OPB portion 45V corresponding to a photosensor portion 42 in the effective pixel portion 50 is set smaller than the area ($=a_1 \times b_1$) of the photosensor portion 42.

In this preferred embodiment, the gate length ($=d_1$) of the gate reading portion 54 in the effective pixel portion 50 is set equal to the gate length ($=d_1$) of the gate reading portion 54 in the vertical OPB portion 45V.

The other configuration is similar to that shown in FIGS. 1 to 4, and the corresponding parts are denoted by the same reference numerals and the description thereof will be omitted herein to avoid repetition.

According to the CCD solid-state imaging device 413 of the third preferred embodiment, the register width $W_3$ of the vertical transfer register portion 43 in the vertical OPB portion 45V can be made larger than the register width $W_2$ in the first preferred embodiment shown in FIG. 2, so that the charge storage capacity in the transfer portion can be increased over the first preferred embodiment.

Accordingly, the general dynamic range in the solid-state imaging device 413 can be improved. Further, the sensitivity linear characteristic, the sensitivity, and the S/N ratio can be improved.

While the CCD solid-state imaging device described in each of the above preferred embodiments is a two-dimensional image sensor, the present invention may be applied to a linear image sensor having an effective pixel portion consisting of a plurality of effective pixels and an optical black portion arranged on one side and having a common charge transfer register portion arranged on the other side.

Further, the solid-state imaging device described in each of the above preferred embodiments is of an interline transfer (IT) type, the present invention may be applied to a frame interline transfer (FIT) type solid-state imaging device.

According to the solid-state imaging device of the present invention, it is possible to increase a charge storage capacity at a portion where a dynamic range is locally most determined, i.e., at the charge transfer register portion in the optical black portion.

As a result, the general dynamic range in the solid-state imaging device can be improved. Further, the increase in the handling charge amount can effect improvements in the sensitivity linear characteristic, the sensitivity, and the S/N ratio.

Accordingly, the present invention can be suitably applied to a solid-state imaging device having a small size and an increased number of pixels.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A solid-state imaging device comprising:
   a matrix of pixels, an effective pixel portion encompassing a first portion of said matrix of pixels, an optical black portion encompassing a second portion of said matrix of pixels, wherein the optical black region is shielded by a light shielding film; and
   a charge transfer register portion commonly provided in said effective pixel portion and said optical black portion, wherein the register width of a first portion of said charge transfer register portion in said optical black portion encompassing said second portion of said matrix of pixels is set larger than the register width of a second portion of said charge transfer register portion in said effective pixel portion encompassing said first portions of said matrix of pixels.

2. A solid-state imaging device comprising:
   an effective pixel portion;
   an optical black portion, wherein the optical black region is shielded by a light shielding film; and
   a charge transfer register portion commonly provided in said effective pixel portion and said optical black portion,
   wherein the register width of a first portion of said charge transfer register portion in said optical black portion is set larger than the register width of a second portion of said charge transfer register portion in said effective pixel portion, and
   wherein said effective pixel portion has a sensor portion comprising a first conduction type semiconductor region and a second conduction type semiconductor region on the surface of a substrate, and said optical black portion has only one of said first conduction type semiconductor region and said second conduction type semiconductor region on the surface of said substrate.

3. A solid-state imaging device according to claim 2, wherein a voltage is applied to said substrate.

4. A solid-state imaging device comprising:
   a matrix of pixels, each pixel having a unit sensor, an effective pixel portion encompassing a first portion of said pixels, an optical black portion encompassing a second portion of said pixels, wherein the optical black region is shielded by a light shielding film;
   and a charge transfer register portion commonly provided in said effective pixel portion and said optical black portion such that a first pixel encompassed in said effective pixel portion corresponds to a second pixel in said optical black portion,
   wherein the area of the unit sensor of the second pixel in said optical black portion is set smaller than the area of said unit sensor of the first pixel in said effective pixel portion.

5. A solid-state imaging device comprising:
   an effective pixel portion;
   an optical black portion, wherein the optical black region is shielded by a light shielding film; and
   a charge transfer register portion commonly provided in said effective pixel portion and said optical black portion such that a first pixel encompassed in said effective pixel portion corresponds to a second pixel in said optical black portion, wherein the area of said unit sensor of the second pixel in said optical black portion is set smaller than the area of said unit sensor of the first pixel in said effective pixel portion, wherein said unit sensor of the first pixel in said effective pixel portion comprises a first conduction type semiconductor region and a second conduction type semiconductor region provided on the surface of a substrate, and said unit sensor of the second pixel in said optical black portion corresponding to said first unit sensor comprises only one of said first conduction type semiconductor region and said second conduction type semiconductor region provided on the surface of said substrate.

6. A solid-state imaging device according to claim 5, wherein a voltage is applied to said substrate.

7. The solid-state imaging device of claim 4, wherein the first pixel in said effective pixel portion has a first gate operably connected to the unit sensor of the first pixel and the second pixel in said optical black portion has a second gate operably connected to the unit sensor of the second pixel, the first gate has a length and the second gate has a different length that is larger than the first gate length.

8. The solid-state imaging device of claim 5, wherein the first pixel in said effective pixel portion has a first gate operably connected to the unit sensor of the first pixel and the second pixel in said optical black portion has a second gate operably connected to the unit sensor of the second pixel, the first gate has a length and the second gate has a different length that is larger than the first gate length.

9. A solid-state imaging device comprising:
   a matrix of pixels, an effective pixel portion encompassing a first portion of said matrix of pixels, an optical black portion encompassing a second portion of said matrix of pixels wherein the optical black region is shielded by a light shielding film; and
   a charge transfer register portion commonly provided in said effective pixel portion and said optical black portion, wherein the register width of a first portion of said charge transfer register portion in said optical black portion encompassing said second portion of said matrix of pixels is set larger in the direction of a gate portion than the register width of a second portion of said charge transfer register portion in said effective pixel portion encompassing said first portions of said matrix of pixels wherein the larger width of the optical black portion increases the charge storage capacity of the charge transfer register portion provided in the optical black portion.

10. A solid-state imaging device comprising:
    an effective pixel portion;
    an optical black portion, wherein the optical black region is shielded by a light shielding film; and
    a charge transfer register portion commonly provided in said effective pixel portion and said optical black portion,
    wherein the register width of a first portion of said charge transfer register portion in said optical black portion is set larger in the direction of a gate portion than the register width of a second portion of said charge transfer register portion in said effective pixel portion wherein the larger width of the optical black portion increases the charge storage capacity of the charge transfer register portion provided in the optical black portion, and
    wherein said effective pixel portion has a sensor portion comprising a first conduction type semiconductor region and a second conduction type semiconductor region on the surface of a substrate, and said optical black portion has only one of said first conduction type semiconductor region and said second conduction type semiconductor region on the surface of said substrate.

11. A solid-state imaging device comprising:

a matrix of pixels, each pixel having a unit sensor, an effective pixel portion encompassing a first portion of said pixels, an optical black portion encompassing a second portion of said pixels wherein the register width of a first portion of the charge transfer register portion in the optical black portion is equal in size with the register width of a second portion of the charge transfer register portion in the effective pixel portion, wherein the optical black region is shielded by a light shielding film;

and a charge transfer register portion commonly provided in said effective pixel portion and said optical black portion such that a first pixel encompassed in said effective pixel portion corresponds to a second pixel in said optical black portion, wherein the area of the unit sensor of the second pixel in said optical black portion is set smaller than the area of said unit sensor of the first pixel in said effective pixel portion to increase the charge storage capacity of the charge transfer register portion provided in the optical black portion.

12. A solid-state imaging device comprising:

an effective pixel portion;

an optical black portion, wherein the optical black region is shielded by a light shielding film; and a charge transfer register portion commonly provided in said effective pixel portion and said optical black portion such that a first pixel encompassed in said effective pixel portion corresponds to a second pixel in said optical black portion wherein the register width of a first portion of the charge transfer register portion in the optical black portion is equal in size with the register width of a second portion of the charge transfer register portion in the effective pixel portion, wherein the area of said unit sensor of the second pixel in said optical black portion is set smaller than the area of said unit sensor of the first pixel in said effective pixel portion to increase the charge storage capacity of the charge transfer register portion provided in the optical black portion, and wherein said unit sensor of the first pixel in said effective pixel portion comprises a first conduction type semiconductor region and a second conduction type semiconductor region provided on the surface of a substrate, and said unit sensor of the second pixel in said optical black portion corresponding to said first unit sensor comprises only one of said first conduction type semiconductor region and said second conduction type semiconductor region provided on the surface of said substrate.

13. A solid-state imaging device comprising:

an effective pixel portion;

an optical black portion, wherein the optical black region is shielded by a light shielding film; and a charge transfer register portion commonly provided in said effective pixel portion and said optical black portion, wherein a register width of a first portion of said charge transfer register portion in said optical black portion is set larger than a register width of a second portion of said charge transfer register portion in said effective pixel portion.

14. A solid-state imaging device according to claim 13, wherein said effective pixel portion has a sensor portion comprising a first conduction type semiconductor region and a second conduction type semiconductor region on the surface of a substrate, and said optical black portion has only one of said first conduction type semiconductor region and said second conduction type semiconductor region on the surface of said substrate.

15. A solid-state imaging device according to claim 13, wherein a voltage is applied to said substrate.

16. A solid-state imaging device comprising:

an effective pixel portion;

an optical black portion including an optical black pixel; and a charge transfer register portion commonly provided in said effective pixel portion and said optical black portion, wherein a register width of a first portion of said charge transfer register portion in said optical black portion is set larger than a register width of a second portion of said charge transfer register portion in said effective pixel portion.

17. A solid-state imaging device according to claim 16, wherein said effective pixel portion has a sensor portion comprising a first conduction type semiconductor region and a second conduction type semiconductor region on the surface of a substrate, and said optical black portion has only one of said first conduction type semiconductor region and said second conduction type semiconductor region on the surface of said substrate.

18. A solid-state imaging device according to claim 16, wherein a voltage is applied to said substrate.

* * * * *